United States Patent
Roy et al.

(10) Patent No.: US 9,672,911 B2
(45) Date of Patent: Jun. 6, 2017

(54) STATIC RANDOM ACCESS MEMORY (SRAM) WITH PROGRAMMABLE RESISTIVE ELEMENTS

(71) Applicant: FREESCALE SEMICONDUCTOR, INC., Austin, TX (US)

(72) Inventors: Anirban Roy, Austin, TX (US); Michael A. Sadd, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/835,363

(22) Filed: Aug. 25, 2015

(65) Prior Publication Data

US 2017/0062049 A1   Mar. 2, 2017

(51) Int. Cl.
| | |
|---|---|
| G11C 14/00 | (2006.01) |
| G11C 5/06 | (2006.01) |
| G11C 13/00 | (2006.01) |
| G11C 11/419 | (2006.01) |
| G11C 11/00 | (2006.01) |

(52) U.S. Cl.
CPC .............. G11C 14/009 (2013.01); G11C 5/06 (2013.01); G11C 11/419 (2013.01); G11C 13/004 (2013.01); G11C 13/0069 (2013.01); G11C 13/0097 (2013.01); *G11C 11/005* (2013.01)

(58) Field of Classification Search
CPC . G11C 14/009; G11C 13/004; G11C 13/0069; G11C 11/419; G11C 13/0097; G11C 5/06
See application file for complete search history.

(56) References Cited

U.S. PATENT DOCUMENTS

| | | | | |
|---|---|---|---|---|
| 4,630,238 A | * | 12/1986 | Arakawa | G11C 14/00 365/182 |
| 6,556,487 B1 | * | 4/2003 | Ratnakumar | G11C 14/00 365/154 |
| 7,760,538 B1 | * | 7/2010 | Paak | G11C 11/412 365/148 |

(Continued)

FOREIGN PATENT DOCUMENTS

JP    2012124703 A    6/2012

OTHER PUBLICATIONS

Wei et al, "Design of a Nonvolatile 7T1R SRAM Cell for Instant-on Operation", IEEE Transactions on Nanotechnology, Jun. 10, 2014, pp. 905-916, vol. 13, Issue 5.

(Continued)

*Primary Examiner* — Richard Elms
*Assistant Examiner* — Jerome Leboeuf

(57) ABSTRACT

A memory device includes a volatile memory cell and a non-volatile memory cell. The non-volatile memory cell includes a first resistive element having a first terminal and a second terminal and a second resistive element having a first terminal and a second terminal. The first terminal of the first resistive element is coupled to the first terminal of the second resistive element at a first node. The second terminal of the first resistive element is coupled to a first source line voltage. The second terminal of the second resistive element is coupled to a second source line voltage. A first transistor includes a first current electrode coupled to a first data storage node of the volatile memory cell, a second current electrode coupled to a supply voltage, and a control gate coupled to the first node.

19 Claims, 5 Drawing Sheets

(56) References Cited

U.S. PATENT DOCUMENTS

| | | |
|---|---|---|
| 8,331,134 B2 | 12/2012 | Chiu et al. |
| 8,422,295 B1 | 4/2013 | Lin et al. |
| 8,537,597 B2 | 9/2013 | Kushida |
| 2013/0027079 A1* | 1/2013 | Nazarian ............... H01L 27/101 326/41 |
| 2013/0028012 A1 | 1/2013 | Fujita et al. |
| 2014/0050025 A1* | 2/2014 | Tsao ................... G11C 14/0063 365/185.08 |
| 2014/0269006 A1 | 9/2014 | Sekar et al. |
| 2014/0269008 A1* | 9/2014 | Baker, Jr. ........... G11C 13/0002 365/148 |
| 2015/0348595 A1* | 12/2015 | Baker, Jr. ................. G11C 5/06 365/72 |

OTHER PUBLICATIONS

Sheu et al, "A Re-RAM integrated 7T2R non-volatile SRAM for normally-off computing application", IEEE Asian Solid-State Circuits Conference (A-SSCC), Nov. 11-13, 2013, pp. 245-248.

Chiu et al, "A low store energy, low VDDmin, nonvolatile 8T2R SRAM with 3D stacked RRAM devices for low power mobile applications", IEEE Symposium on VLSI Circuits (VLSIC), Jun. 16-18, 2010, pp. 229-230.

Xue et al, "Novel RRAM programming technology for instant-on and high-security FPGA's", IEEE 9th International Conference on ASIC (ASICON), Oct. 25-28, 2011, pp. 291-294.

Guan et al, "On the Switching Parameter Variation of Metal-Oxide RRAM—Part I: Physical Modeling and Simulation Methodology", IEEE Transactions on Electron Devices, Feb. 14, 2012, pp. 1172-1182, vol. 59, Issue 4.

* cited by examiner

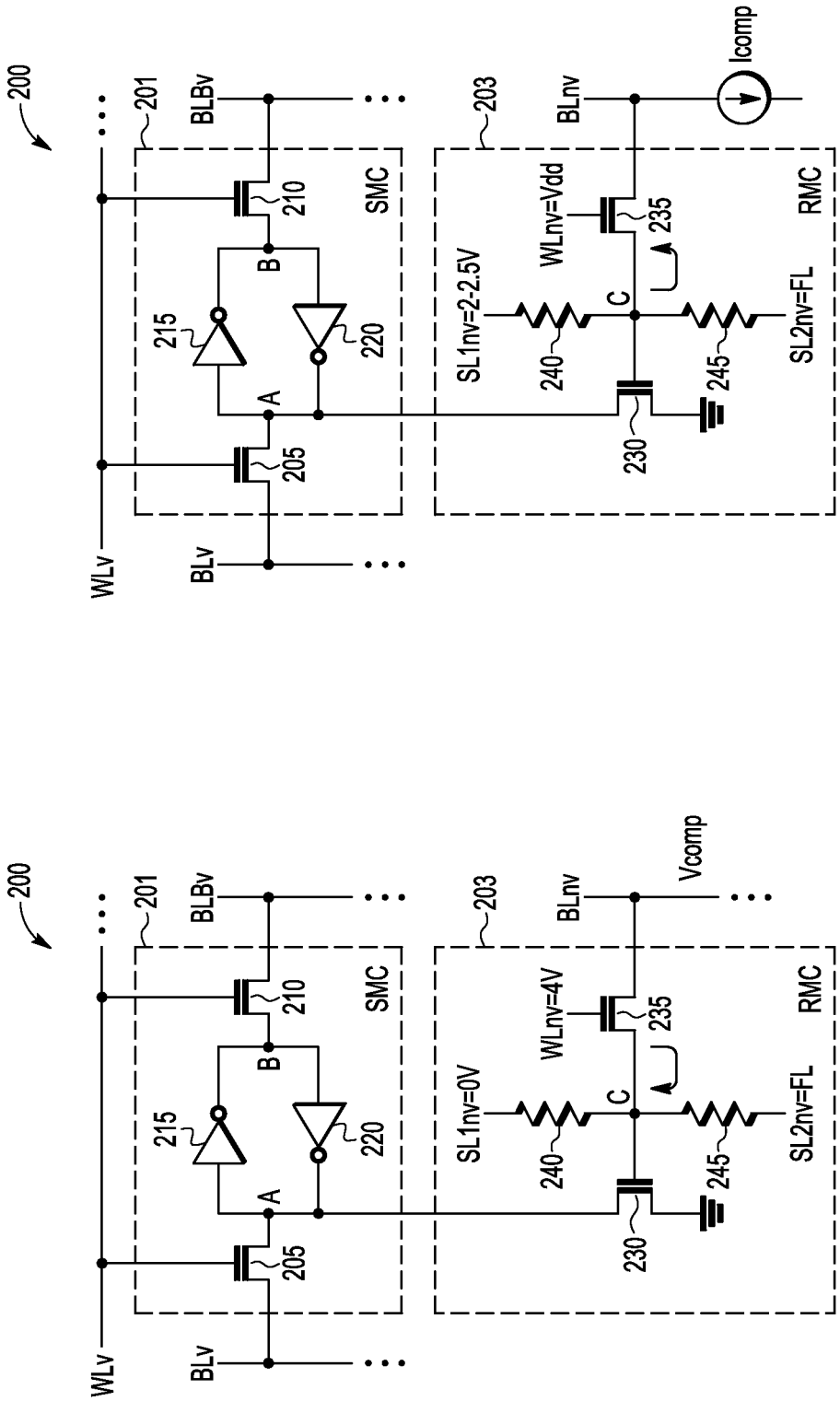

… (1) …

STATIC RANDOM ACCESS MEMORY (SRAM) WITH PROGRAMMABLE RESISTIVE ELEMENTS

BACKGROUND

Field

This disclosure relates generally to memories, and more specifically, to static random access memory (SRAM) with programmable resistive elements.

Related Art

A random access memory (RAM) is a type of memory that is often implemented as volatile memory. One type of RAM is static RAM (SRAM), which uses latching circuitry to store data. A traditional SRAM includes a plurality of bitcells, where each bitcell stores a bit of data. In a traditional SRAM, the bitcells statically store data, as opposed to a dynamic RAM (DRAM), where the data stored at each bitcell needs to be periodically refreshed. However, a traditional SRAM is still considered volatile memory because the data stored by the SRAM is lost when power to the SRAM is lost.

BRIEF DESCRIPTION OF THE DRAWINGS

The present invention may be better understood, and its numerous objects, features, and advantages made apparent to those skilled in the art by referencing the accompanying drawings.

FIG. 3-8 illustrate circuit diagrams depicting example signals applied at nodes of the memory cell configuration of FIG. 2 during various example operations, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

An example resistive random access memory (resistive RAM or RRAM) cell is implemented using a transistor and a programmable resistive element (also referred to as a 1T1R RRAM cell). The programmable resistive element is made of a dielectric solid-state material whose resistance can be changed using an appropriate voltage. Each programmable resistive element implements at least two levels of resistance (also referred to as resistive states): a high resistive state (HRS) and a low resistive state (LRS). RRAM technology is beneficial for implementation in non-volatile memory, due to its low power consumption, faster switching speeds than phase-change RAM (PRAM), and simpler cell structure than magnetoresistive RAM (MRAM). However, RRAM technology requires high voltages to change resistive state of the programmable resistive elements, which are larger than the voltages usually implemented in volatile memory systems. RRAM technology also requires thick oxide transistors that can withstand the RRAM high voltages, which prevents one from merely replacing thick oxide transistors with logic transistors (or thin oxide transistors), which cannot handle RRAM high voltages.

The present disclosure provides for a memory device that implements a compact non-volatile SRAM. Memory cells of the non-volatile SRAM include both static RAM (SRAM) memory cells and resistive RAM (RRAM) memory cells, which are integrated in a gain-cell configuration. The SRAM cells can be implemented using a standard 6 transistor (6T) SRAM cell, and the RRAM cells can be implemented using a 1T1R cell. During a restore operation, the programmable resistive elements of an RRAM cell form a resistance ratio to drive a restore output to a coupled SRAM cell. During normal operation, data values are written to the SRAM cells. The data of the SRAM cells can then be stored in the RRAM cells during a store operation. Accordingly, the memory device provides a non-volatile SRAM that maintains data in a non-volatile manner, even when power is not provided to the memory device.

Example Embodiments

Figure 1:
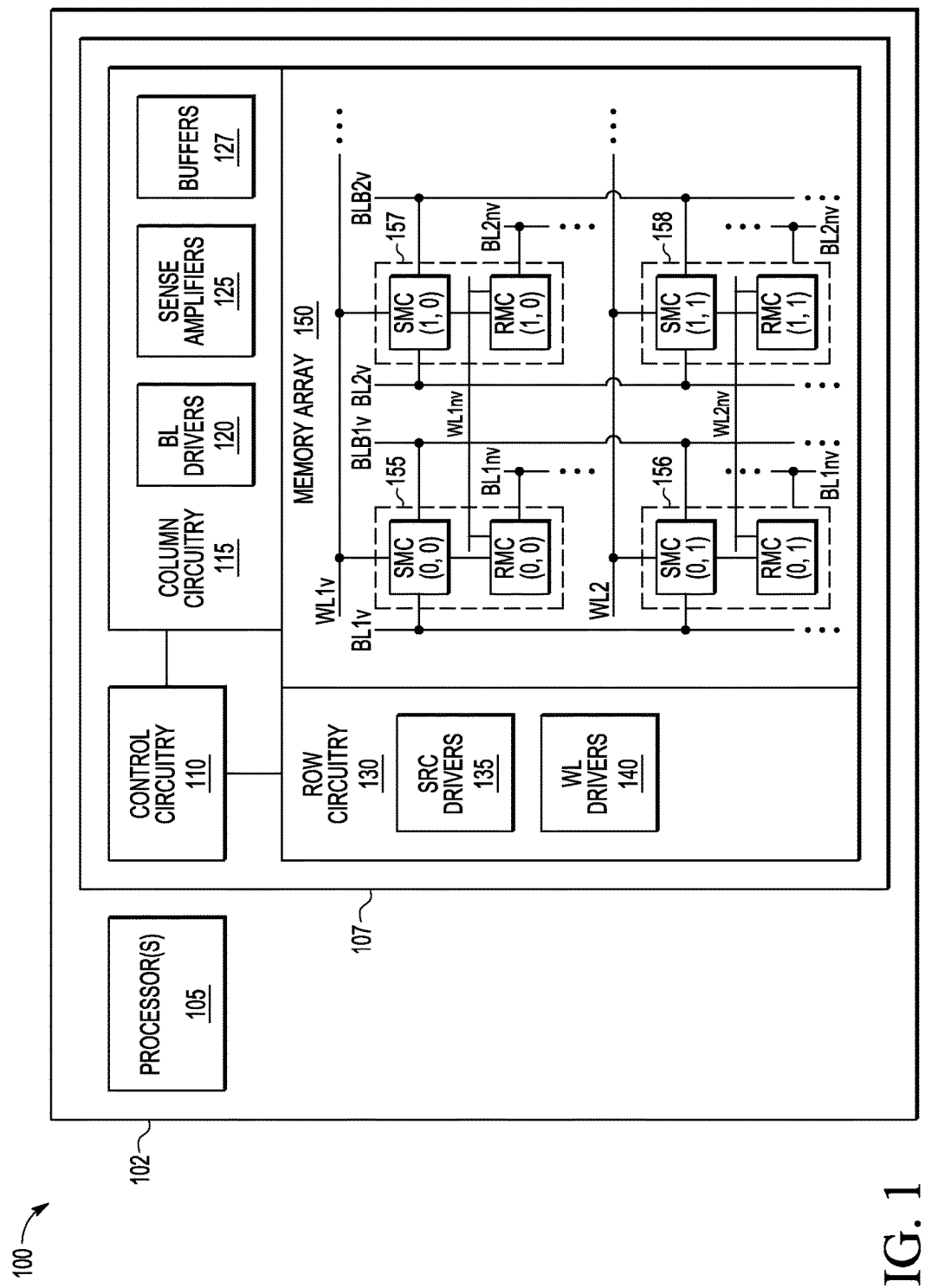
FIG. 1 illustrates a block diagram depicting an example processing system that includes a memory device having integrated SRAM cells and RRAM cells in which the disclosure is implemented, according to some embodiments.

FIG. 1 illustrates a block diagram depicting an example processing system 100 that includes one or more processors 105 and a memory device 107 having integrated SRAM cells and RRAM cells. Memory device 107 includes control circuitry 110 coupled to column circuitry 115 and to row circuitry 130, and a memory array 150 also coupled to column circuitry 115 and to row circuitry 130.

Memory array 150 includes a plurality of memory cells that include integrated SRAM cells and RRAM cells, as further discussed below. The plurality of memory cells are arranged in N rows and M columns, with N and M being integers of one or more. Memory array 150 can be characterized as an SRAM that stores data in a non-volatile manner by utilizing RRAM technology. In other words, memory array 150 provides a non-volatile SRAM. Four example memory cells 155-158 are shown in a simplified 2×2 arrangement in FIG. 1 for ease of illustration and explanation, although memory array 150 may include a much larger number of memory cells.

Each memory cell of memory array 150 includes an SRAM memory cell (SMC) and an RRAM memory cell (RMC). SMC is also referred to herein as a volatile memory cell, while RMC is referred to herein as a non-volatile memory cell. In the configuration illustrated in FIG. 1, each memory cell includes SMC([i], [j]) and RMC([i], [j]), where [i] and [j] are integers of one or more. The integer [i] corresponds to a column position of each cell in memory array 150, while the integer [j] corresponds to a row position of each cell in memory array 150.

Memory array 150 also includes two sets of word lines. One set of an N number of word lines are coupled with SMCs, and are also referred to as volatile word lines (WLv), where each WLv corresponds to a row of memory cells in memory array 150. The other set of an N number of word lines are coupled with RMCs, and are also referred to as non-volatile word lines (WLnv), where each WLnv corresponds to a row of memory cells in memory array 150. Memory array 150 also includes two sets of bit lines. One set of bit lines includes an M number of paired bit lines, where each pair includes a true bit line and a complementary bit line that are coupled with SMCs, and are also referred to as volatile true bit lines (BLv) and volatile complementary bit lines (BLBv). Each pair of BLv and BLBv corresponds to a column of memory cells in memory array 150. The other set of an M number of bit lines are coupled with RMCs, and are also referred to as non-volatile bit lines (BLnv), where each BLnv corresponds to a column of memory cells in memory array 150. In this manner, each memory cell in memory array 150 is coupled to a corresponding WLv, a corresponding pair of BLv and BLBv, a corresponding WLnv, and a corresponding BLnv.

Although FIG. 1 illustrates an example embodiment of memory array 150, memory array 150 can include any suitable number of memory cells, word lines, true and complementary bit lines, and non-volatile bit lines. An example memory cell configuration that includes an SRAM memory cell (SMC) and an RRAM memory cell (RMC) is discussed below in connection with FIG. 2.

Control circuitry 110 is configured to control column circuitry 115 and row circuitry 130 to implement memory operations (e.g., read and write operations on SMCs, restore and store operations on RMCs) on memory array 150, such as by providing control signals and addresses to column circuitry 115 and row circuitry 130. Column circuitry 115 includes bit line (BL) drivers 120 for activating volatile true, volatile complementary, and non-volatile bit lines of memory array 150 during memory operations. Column circuitry 115 also includes sense amplifiers 125 for reading data values from bit lines of memory array 150 during some memory operations. Sense amplifiers 125 are also configured to provide data from memory array 150 to a requesting processor 105, such as in response to a read request. Column circuitry 115 also includes one or more buffers 127 for temporarily storing data from an SMC that will be written to an RMC of memory array 150 during a store operation. Row circuitry 130 includes word line (WL) drivers 140 for activating volatile and non-volatile word lines of memory array 150 during memory operations. Row circuitry 130 also includes source line (SRC) drivers 135 for providing one or more source or supply voltages to nodes in the memory cells of memory array 150 (e.g., at nodes in RMCs).

Processing system 100 can be implemented using CMOS (complementary metal-oxide semiconductor) transistors as a System On Chip (SOC) or other integrated circuit device which includes at least one processor 105 (or computing device) coupled to memory device 107 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternate embodiment, memory device 107 is implemented alone in an integrated circuit without any other devices. In another alternative embodiment, memory device 104 is part of a larger system on the integrated circuit. Additionally, SMC and RMC of memory cells of memory array 150 can be implemented with similar components, as further discussed below in connection with FIG. 2.

Figure 2:
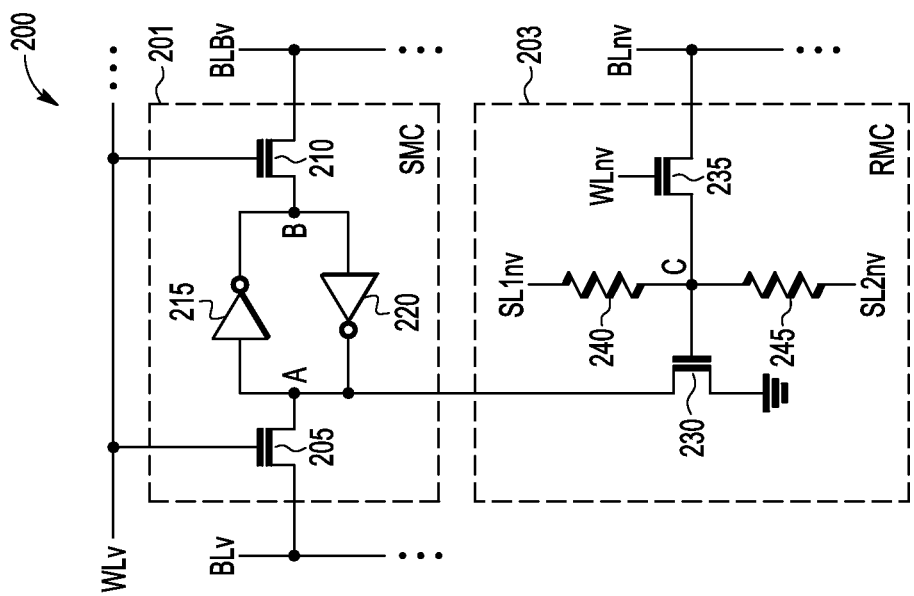
FIG. 2 illustrates a circuit diagram depicting an example memory cell configuration utilized in the memory device of FIG. 1, according to some embodiments.

FIG. 2 illustrates a circuit diagram depicting an example memory cell configuration utilized in memory cells of the memory device 107 of FIG. 1, such as memory cells 155-158. Memory cell 200 includes an SRAM memory cell (SMC) 201 and an RRAM memory cell (RMC) 203. SMC 201 includes a pair of cross-coupled inverters 215 and 220, with the output of inverter 220 coupled to the input of inverter 215 via a storage node A, and the output of inverter 215 coupled to the input of inverter 220 via a storage node B. Each inverter outputs a state, which is either a logic level one state or a logic level zero state, onto a respective one of storage nodes A and B. The state that is output by inverter 220 onto storage node A is opposite the state that is output by inverter 215 onto storage node B, where the cross-coupled nature of inverters 215 and 220 reinforces each other's state and retains such state respectively at storage nodes A and B. The state retained at storage nodes A and B (where storage node A retains a true state and storage node B retains a complementary state) represents or encodes a data value, or a bit, that is stored by SMC while power is provided to SMC 201.

SMC 201 also includes transistors 205 and 210, also referred to as pass or access transistors. Transistors 205 and 210 allow access to read or write the data value (or the state) on storage nodes A and B, which in turn controls the state output by inverters 215 and 220. Transistor 205 has a first current electrode coupled to a volatile true bit line BLv, a second current electrode coupled to storage node A, and a control electrode coupled to volatile word line WLv. Transistor 210 has a first current electrode coupled to storage node B, a second current electrode coupled to volatile complementary bit line BLBv, and a control electrode coupled to volatile word line WLv.

RMC 203 includes a pair of programmable resistive elements 240 and 245 (also referred to as R240 and R245) that are each configured to store a resistive state in a non-volatile manner, where the resistive state is either a high resistive state (HRS) or a low resistive state (LRS). R240 and R245 are coupled to one another at storage node C. R240 and R245 are also coupled to a respective one of source line (SL) nodes SL1*nv* and SL2*nv*.

RMC 203 also includes transistors 230 (also referred to as a gain transistor) and transistor 235 (also referred to as a pass or an access transistor). In some embodiments, transistors 230 and 235 are input/output transistors that have a thicker oxide to protect against the high voltages utilized in program, erase, and forming operations for RMC 203. Transistor 230 allows data to be transferred from RMC 203 to SMC 201 during a restore operation, and isolates RMC 203 from SMC 201 during normal operation of memory array 150, as further discussed below. Transistor 235 allows access to programmable resistive elements 240 and 245 to write the respective resistive states of R240 and R245. The state retained at node C is based on the resistive states of R240 and R245 and represents or encodes a data value, or bit, that is stored by RMC in a non-volatile manner, even when power is not provided to RMC 203. For example, during a restore operation, the resistive states of R240 and R245 form a resistance ratio that either drives node C high to represent a logic level zero state or low to represent a logic level one state, as further discussed below. Transistor 230 has a first current electrode coupled to storage node A, a second current electrode coupled to ground, and a control electrode coupled to storage node C. Transistor 235 has a first current electrode coupled to storage node C, a second current electrode coupled to non-volatile bit line BLnv, and a control electrode coupled to non-volatile word line WLnv.

Figure 3:
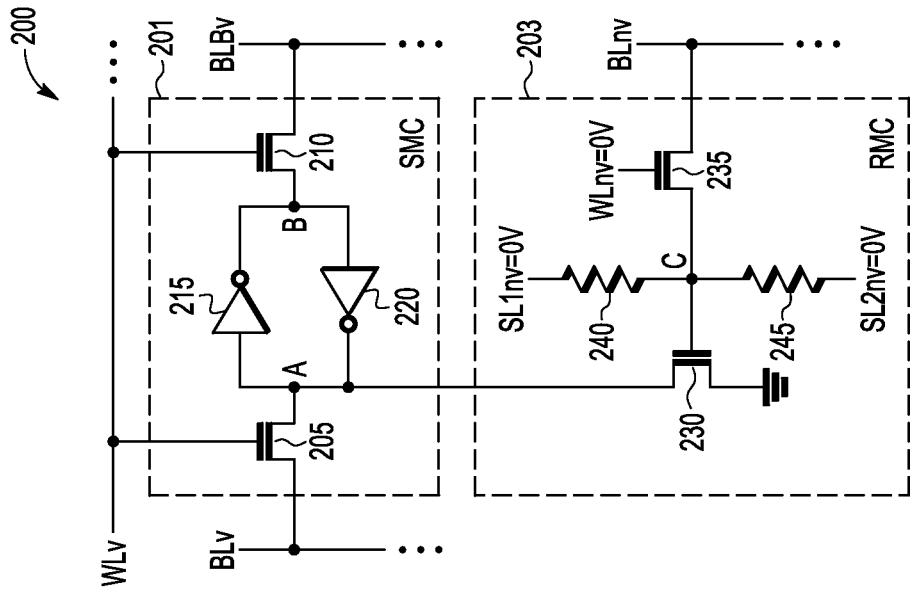

FIG. 3 illustrates a circuit diagram depicting example signals applied at nodes of the memory cell configuration of FIG. 2 during normal operation of memory array 150. During normal operation of memory array 150 (or during normal operation of the non-volatile SRAM), all SMCs of memory array 150 are enabled, while all RMCs of memory array 150 are disabled. An RMC is disabled by grounding SL1*nv*, SL2*nv*, and WLnv. Since the voltage at node C is substantially equivalent to 0V, transistor 230 remains off (or non-conductive) and isolates RMC from SMC during normal operation of memory array 150.

Figure 4:
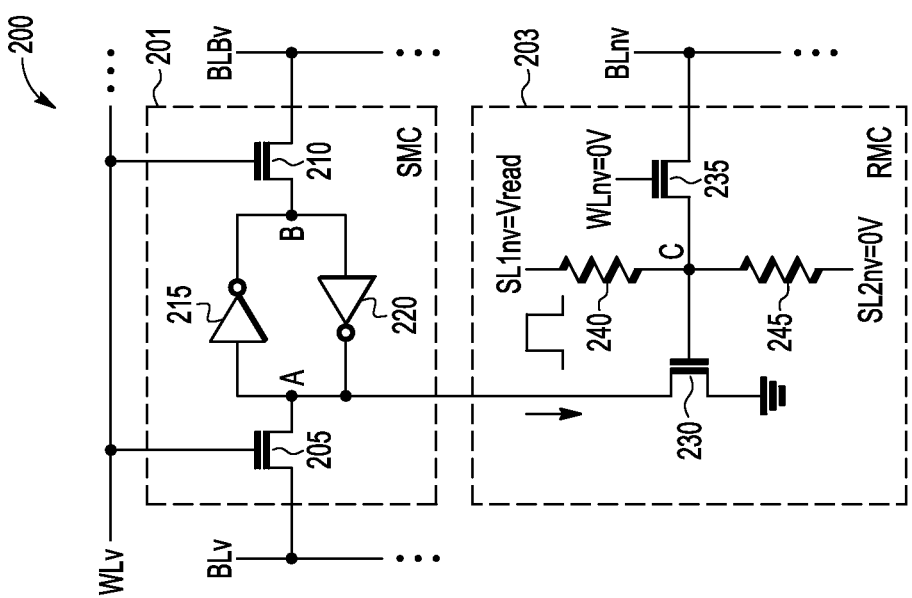

FIG. 4 illustrates a circuit diagram depicting example signals applied at nodes of the memory cell configuration of FIG. 2 during a restore operation of memory array 150, which is performed outside of normal operation of memory array 150, such as at start up of processing system 100 (e.g., upon power up of memory array 150). A restore operation is performed in parallel across all memory cells of memory array 150. An initial step of a restore operation includes writing a logic level one state into all SMCs of memory array 150, where storage node A goes high (or stores a logic level one state). A subsequent step of the restore operation includes grounding SL2$nv$ and WL$nv$ of all RMCs in memory array 150. Since WL$nv$ is grounded, transistor 235 remains off (or non-conducting) and isolates RMC from BL$nv$. Then, a read voltage (Vread) is then pulsed on SL1$nv$ of all RMCs in memory array 150. Transistor 230 either pulls down storage node A to a logic level zero state, or leaves storage node A at a logic level one state. The read voltage can be selected based on read disturb considerations of the programmable resistive elements, especially those considerations for HRS.

For example, an RMC that has R240 in LRS (which provides a small or low resistance) and R245 in HRS (which provides a large or high resistance), the voltage at storage node C goes high and is large enough to turn transistor 230 on (or conducting). The current terminal of transistor 230 that is coupled to storage node A in SMC pulls down storage node A to a logic level zero state. In other words, the combination of R240 being in LRS and R245 being in HRS represents a logic level zero state.

In another example, an RMC that has R240 in HRS (which provides a large or high resistance) and R245 in LRS (which provides a small or low resistance), the voltage at storage node C goes low and is not large enough to turn transistor 230 on (or non-conducting). Storage node A in SMC continues to store a logic level one state. In other words, the combination of R240 being in HRS and R245 being in LRS represents a logic level one state.

FIG. 5-8 illustrate circuit diagrams depicting example signals applied at nodes of the memory cell configuration of FIG. 2 during various steps of a store operation of memory array 150, which is performed outside of normal operation of memory array 150, such as during a back up procedure of processing system 100 that writes the data stored by SMCs of memory array 150 into corresponding RMCs of memory array 150. A store operation is a decoded operation that is performed on RMCs of memory array 150 on an address-by-address or row-by-row basis. An initial step of a store operation includes storing the data of the SMCs of a selected address in buffers 127, because the SMCs of the selected address are not accessed when the data is written to the RMCs of the selected address. A store operation then writes the data stored in buffers 127 to the RMCs of the selected address. A store operation includes a program operation step and a subsequent erase operation step to write the resistive states of the programmable resistive elements of the RMCs of the selected address or row in memory array 150 to reflect the data of the buffers 127, where the resistive states together represent either a logic level one state or a logic level zero state.

Figure 5:
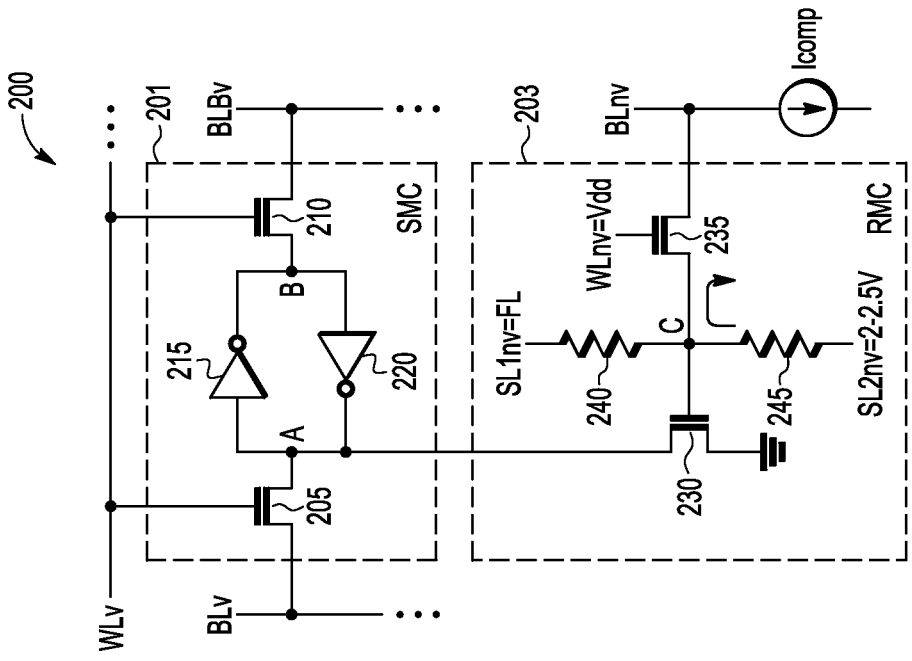
Figure 8:
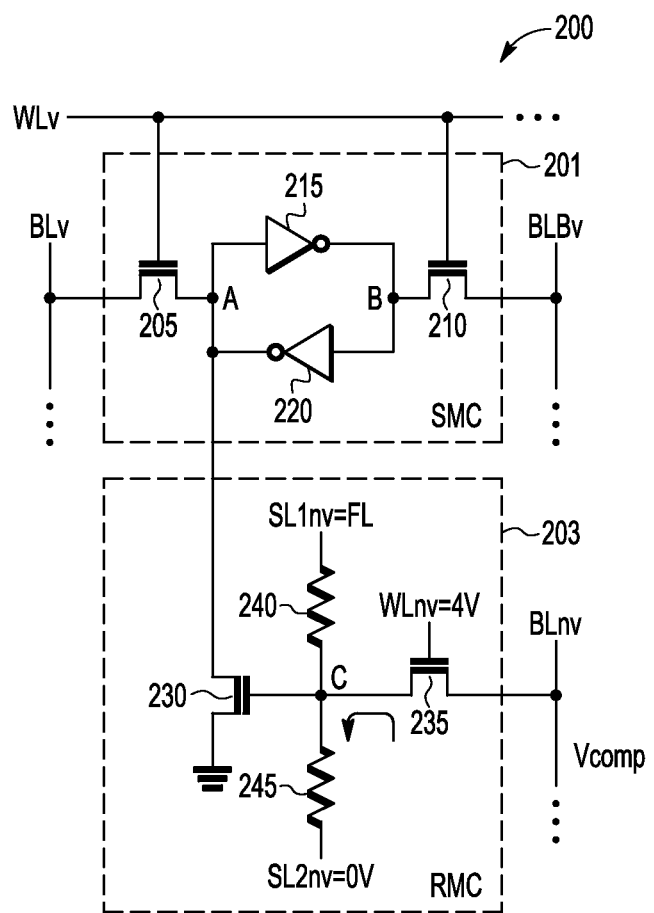

It is noted that during the program and erase operation discussed below, transistor 230 may or may not become conductive, depending on the resistive states that are written to programmable resistive elements of the RMCs, which affects the resulting voltage at node C. If transistor 230 becomes conductive during a program or erase operation, the value stored at the coupled SMC (at storage node A) will be pulled down, possibly altering the value stored at the coupled SMC. In some embodiments, a restore operation is performed (as discussed above in connection with FIG. 4) for the SMCs of the selected address after the write operation is complete, in order to refresh data that might have been altered during the write operation. FIG. 5 and FIG. 6 illustrate steps of a store operation for storing a logic level one state into an RMC. FIG. 7 and FIG. 8 illustrate steps of a store operation for storing a logic level zero state into an RMC.

FIG. 5 illustrates a program operation performed on R245 to write LRS, as part of storing a logic level one state into an RMC of memory array 150. After data of the selected address has been stored in buffers 127, a compliance current (Icomp) is applied to BL$nv$, which provides a current limit in order to prevent damage to the memory device 107 during the program operation. An appropriate voltage (e.g., 2 to 2.5V) is applied at SL2$nv$, while SL1$nv$ (and R240) is left floating. A supply voltage Vdd (e.g., 2 to 3V) is applied to WL$nv$ (which makes transistor 235 conducting). A current path is formed from SL2$nv$ through R245 and transistor 235 to BL$nv$, which writes LRS to R245.

FIG. 6 illustrates an erase operation performed on R240 to write HRS, as part of storing a logic level one state into an RMC of memory array 150. After LRS is written to R245, Icomp is removed from BL$nv$. A compliance voltage (Vcomp) is then provided on BL$nv$. SL1$nv$ is grounded, while SL2$nv$ (and R245) is left floating. An appropriate voltage is applied at WL$nv$, such as 4V (which makes transistor 235 conducting). A current path is formed from BL$nv$ through transistor 235 and R240 to SL1$nv$, which writes HRS to R240.

FIG. 7 illustrates a program operation performed on R240 to write LRS, as part of storing a logic level zero state into an RMC of memory array 150. After data of the selected address has been stored in buffers 127, compliance current (Icomp) is applied to BL$nv$. An appropriate voltage (e.g., 2 to 2.5V) is applied at SL1$nv$, while SL2$nv$ (and R245) is left floating. Supply voltage Vdd is applied to WL$nv$ (which makes transistor 235 conducting). A current path is formed from SL1$nv$ through R240 and transistor 235 to BL$nv$, which writes LRS to R240.

FIG. 8 illustrates an erase operation performed on R245 to write HRS, as part of storing a logic level zero state into an RMC of memory array 150. After LRS is written to R240, Icomp is removed from BL$nv$. Compliance voltage (Vcomp) is then provided on BL$nv$. SL2$nv$ is grounded, while SL1$nv$ (and R240) is left floating. An appropriate voltage is applied at WL$nv$, such as 4V (which makes transistor 235 conducting). A current path is formed from BL$nv$ through transistor 235 and R245 to SL2$nv$, which writes HRS to R245.

By now it should be appreciated that there has been provided a static random access memory (SRAM) that utilizes resistive RAM (RRAM) technology to store data in a non-volatile manner. In one embodiment of the present disclosure, a memory device is provided, which includes a volatile memory cell; a non-volatile memory cell that includes: a first resistive element having a first terminal and a second terminal; a second resistive element having a first terminal and a second terminal, wherein the first terminal of the first resistive element is coupled to the first terminal of the second resistive element at a first node, the second terminal of the first resistive element is coupled to a first source line voltage, the second terminal of the second resistive element is coupled to a second source line voltage;

a first transistor having a first current electrode coupled to a first data storage node of the volatile memory cell, a second current electrode coupled to a supply voltage, and a control gate coupled to the first node.

One aspect of the above embodiment provides that the non-volatile memory cell further includes a second transistor including a first current electrode coupled to the first node, a second current electrode coupled to a non-volatile bit line, and a control electrode coupled to a non-volatile word line.

Another aspect of the above embodiment provides that the volatile memory cell includes a first pass gate having a first current electrode coupled to a true volatile bit line, a second current electrode coupled to the first data storage node, and a control electrode coupled to a volatile word line.

A further aspect of the above embodiment provides that the volatile memory cell further includes a second pass gate having a first current electrode coupled to a complementary volatile bit line, a second current electrode coupled to a second data storage node, and a control electrode coupled to the volatile word line.

A still further aspect of the above embodiment provides that the memory device further includes a first inverter including an input coupled to the first data storage node and an output coupled to the second data storage node; and a second inverter including an output coupled to the first data storage node and an input coupled to the second data storage node.

Another aspect of the above embodiment provides that the non-volatile memory cell is disabled when voltage on a nonvolatile wordline and the first and second source lines is set to ground.

Another aspect of the above embodiment provides that data from the non-volatile memory cell is restored to the volatile memory cell when, after a "1" is written to the volatile memory cell, a read voltage is applied at the first source line while a first bias voltage is applied at the second source line and a second bias voltage is applied at the non-volatile word line, wherein the first bias voltage is less than the read voltage and the second bias voltage is less than the first bias voltage.

Another further aspect of the above embodiment provides that a "1" in the volatile memory cell is stored in the non-volatile memory cell when, after the second resistive element is programmed to a low resistance state while current at the non-volatile bit line is limited, the first resistive element is erased to a high resistance state while voltage at the non-volatile bit line is limited.

Another further aspect of the above embodiment provides that a "0" in the volatile memory cell is stored in the non-volatile memory cell when, after the first resistive element is programmed to a low resistance state while current at the non-volatile bit line is limited, the second resistive element is erased to a high resistance state while voltage at the non-volatile bit line is limited.

Another further aspect of the above embodiment provides that transistors in the volatile memory cell are low voltage transistors and the first and second transistors in the non-volatile memory cell are high voltage transistors.

Another aspect of the above embodiment provides that a resistance level of the first resistive element is programmable between a high resistance state and a low resistance state, and a resistance level of the second resistive element is programmable between another high resistance state and another low resistance state.

In another embodiment of the present disclosure, a method of operating a memory device is provided, the method includes restoring data from a non-volatile memory cell to a volatile memory cell by: after writing a "1" into the volatile memory cell, applying a read voltage at a first source line coupled to a first terminal of a first programmable resistive element, wherein a second terminal of the first resistive element is coupled at a first node to a first terminal of a second programmable resistive element and a control electrode of a first transistor, a second terminal of the second resistive element is coupled to a first bias voltage at a second source line that is less than the read voltage, a first current electrode of the first transistor is coupled to a data storage node of the volatile memory cell, and a second current electrode of the first transistor is coupled to a first supply voltage.

One aspect of the above embodiment provides that the method further includes writing a "0" to the volatile memory cell when the first programmable resistive element is in a low resistance state, the second programmable resistive element is in a high resistance state, and voltage at the first node is high during restore.

Another aspect of the above embodiment provides that the method further includes writing a "1" to the volatile memory cell when the first programmable resistive element is in a high resistance state, the second programmable resistive element is in a low resistance state, and voltage at the first node is low during restore.

Another aspect of the above embodiment provides that the method further includes transferring a "1" in the volatile memory cell to the non-volatile memory cell by programming the second programmable resistive element to a low resistance state while current at the non-volatile bit line is limited, and erasing the first programmable resistive element to a high resistance state while voltage at the non-volatile bit line is limited; transferring a "0" in the volatile memory cell to the non-volatile memory cell by programming the first programmable resistive element to a low resistance state while current at the non-volatile bit line is limited, and erasing the second programmable resistive element to a high resistance state while voltage at the non-volatile bit line is limited.

A further aspect of the above embodiment provides that the method further includes reading the data in the volatile memory cell and storing the data read from the volatile memory to a storage buffer before transferring the "1" or the "0" to the non-volatile memory.

Another aspect of the above embodiment provides that the method further includes while restoring the data, applying a second bias voltage at a non-volatile word line while the first bias voltage is applied at a second source line, wherein the second bias voltage is less than the first bias voltage, the non-volatile word line is coupled to a control electrode of a second transistor in the non-volatile memory cell, and the second transistor further includes a first current electrode coupled to the first node and a second current electrode coupled to a non-volatile bit line.

In another embodiment of the present disclosure, a processing system on a chip (SOC) is provided, which includes a processor on a semiconductor substrate; a memory device on the semiconductor substrate, the memory device is coupled to communicate with the processor and includes: an array of volatile memory cells and corresponding non-volatile memory cells, each of the non-volatile memory cells includes: a first programmable resistive element having a first terminal and a second terminal, wherein a resistance level of the first programmable resistive element varies between a high resistance state and a low resistance state; a second programmable resistive element having a first terminal and a second terminal, wherein a resistance level of the second programmable resistive element varies between a high resistance state and a low resistance state, the first terminal of the first programmable resistive element is coupled to the first terminal of the second resistive element at a first node, the second terminal of the first programmable resistive element is coupled to a first source line voltage, the second terminal of the second resistive element is coupled to a second source line voltage; a first transistor having a first current electrode coupled to a first data storage node of the volatile memory cell, a second current electrode coupled to a supply voltage, and a control gate coupled to the first node.

One aspect of the above embodiment provides that a "1" in one of the volatile memory cells is stored in a corresponding one of the non-volatile memory cells when the second resistive element is programmed to the low resistance state and the first resistive element is erased to the high resistance state; a "0" in the one of the volatile memory cells is stored in the corresponding one of the non-volatile memory cells when the first resistive element is programmed to the low resistance state, the second resistive element is erased to the high resistance state.

Another aspect of the above embodiment provides that data in one of the non-volatile memory cells is programmed into a corresponding one of the volatile memory cell when, after a "1" is written to the volatile memory cell, a read voltage is applied at the first source line while a first bias voltage is applied at the second source line and a second bias voltage is applied at the non-volatile word line.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory device comprising:
   a volatile memory cell; and
   a non-volatile memory cell that includes:
   a first resistive element having a first terminal and a second terminal;
   a second resistive element having a first terminal and a second terminal, wherein
   the first terminal of the first resistive element is coupled to the first terminal of the second resistive element at a first node,
   the second terminal of the first resistive element is coupled to a first source line voltage,
   the second terminal of the second resistive element is coupled to a second source line voltage;
   a first transistor having a first current electrode coupled to a first data storage node of the volatile memory cell, a second current electrode coupled to a supply voltage, and a control gate coupled to the first node; and
   a second transistor including a first current electrode coupled to the first node, a second current electrode coupled to a non-volatile bit line, and a control electrode coupled to a non-volatile word line;

wherein data from the non-volatile memory cell is restored to the volatile memory cell when, after a "1" is written to the volatile memory cell, a read voltage is applied at the first source line while a first bias voltage is applied at the second source line and a second bias voltage is applied at the non-volatile word line.

2. The memory device of claim 1, wherein the volatile memory cell further comprises:
a first pass transistor having a first current electrode coupled to a true volatile bit line, a second current electrode coupled to the first data storage node, and a control electrode coupled to a volatile word line.

3. The memory device of claim 2, wherein the volatile memory cell further comprises:
a second pass transistor having a first current electrode coupled to a complementary volatile bit line, a second current electrode coupled to a second data storage node, and a control electrode coupled to the volatile word line.

4. The memory device of claim 3, further comprising:
a first inverter including an input coupled to the first data storage node and an output coupled to the second data storage node; and
a second inverter including an output coupled to the first data storage node and an input coupled to the second data storage node.

5. The memory device of claim 1, wherein the non-volatile memory cell is disabled when voltage on a non-volatile wordline and the first and second source lines is set to ground.

6. The memory device of claim 1,
wherein the first bias voltage is less than the read voltage and the second bias voltage deactivates the second transistor.

7. The memory device of claim 1, wherein a "1" in the volatile memory cell is stored in the non-volatile memory cell when, after the second resistive element is programmed to a low resistance state while current at the non-volatile bit line is limited, the first resistive element is erased to a high resistance state while voltage at the non-volatile bit line is limited.

8. The memory device of claim 1, wherein a "0" in the volatile memory cell is stored in the non-volatile memory cell when, after the first resistive element is programmed to a low resistance state while current at the non-volatile bit line is limited, the second resistive element is erased to a high resistance state while voltage at the non-volatile bit line is limited.

9. The memory device of claim 1, wherein transistors in the volatile memory cell are low voltage transistors and the first and second transistors in the non-volatile memory cell are high voltage transistors.

10. The memory device of claim 1, wherein a resistance level of the first resistive element is programmable between a high resistance state and a low resistance state, and a resistance level of the second resistive element is programmable between another high resistance state and another low resistance state.

11. The memory device of claim 1, wherein the supply voltage comprises a ground supply voltage.

12. A method of operating a memory device comprising:
restoring data from a non-volatile memory cell to a volatile memory cell by:
writing a "1" into the volatile memory cell via a pass transistor having a first current electrode coupled to a volatile bit line, a second current electrode coupled to a data storage node of the volatile memory cell, and a control electrode coupled to a volatile word line;
after the writing the "1" into the volatile memory cell, applying a read voltage at a first source line coupled to a first terminal of a first programmable resistive element of the non-volatile memory cell, wherein
a second terminal of the first resistive element is coupled at a first node to a first terminal of a second programmable resistive element and a control electrode of a first transistor,
a second terminal of the second resistive element is coupled to a first bias voltage at a second source line that is less than the read voltage,
a first current electrode of the first transistor is coupled to the data storage node of the volatile memory cell, and
a second current electrode of the first transistor is coupled to a first supply voltage.

13. The method of claim 12, further comprising:
writing a "0" to the volatile memory cell when the first programmable resistive element is in a low resistance state, the second programmable resistive element is in a high resistance state, and voltage at the first node is high during restore.

14. The method of claim 12, further comprising:
writing a "1" to the volatile memory cell when the first programmable resistive element is in a high resistance state, the second programmable resistive element is in a low resistance state, and voltage at the first node is low during restore.

15. The method of claim 12, further comprising:
transferring a "1" in the volatile memory cell to the non-volatile memory cell by
programming the second programmable resistive element to a low resistance state while current at a non-volatile bit line is limited, and
erasing the first programmable resistive element to a high resistance state while voltage at the non-volatile bit line is limited;
transferring a "0" in the volatile memory cell to the non-volatile memory cell by
programming the first programmable resistive element to a low resistance state while current at the non-volatile bit line is limited, and
erasing the second programmable resistive element to a high resistance state while voltage at the non-volatile bit line is limited.

16. The method of claim 15, further comprising:
reading the data in the volatile memory cell and storing the data read from the volatile memory to a storage buffer before transferring the "1" or the "0" to the non-volatile memory.

17. The method of claim 12, further comprising:
while restoring the data, applying a second bias voltage at a non-volatile word line while the first bias voltage is applied at the second source line, wherein
the non-volatile word line is coupled to a control electrode of a second transistor in the non-volatile memory cell,
the second bias voltage deactivates the second transistor, and
the second transistor further includes a first current electrode coupled to the first node and a second current electrode coupled to a non-volatile bit line.

18. A processing system on a chip (SOC) comprising:
a processor on a semiconductor substrate; and a memory device on the semiconductor substrate, the memory device is coupled to communicate with the processor and includes:
an array of volatile memory cells and corresponding non-volatile memory cells, wherein
each of the volatile memory cells includes:
a pass transistor having a first current electrode coupled to a volatile bit line, a second current electrode coupled to a data storage node, and a control electrode coupled to a volatile word line, and
each of the non-volatile memory cells includes:
a first programmable resistive element having a first terminal and a second terminal, wherein a resistance level of the first programmable resistive element varies between a high resistance state and a low resistance state;
a second programmable resistive element having a first terminal and a second terminal, wherein a resistance level of the second programmable resistive element varies between a high resistance state and a low resistance state,
the first terminal of the first programmable resistive element is coupled to the first terminal of the second resistive element at a first node,
the second terminal of the first programmable resistive element is coupled to a first source line voltage,
the second terminal of the second resistive element is coupled to a second source line voltage;
a first transistor having a first current electrode coupled to the data storage node of the volatile memory cell, a second current electrode coupled to a supply voltage, and a control gate coupled to the first node;
wherein data in one of the non-volatile memory cells is programmed into a corresponding one of the volatile memory cells when, after a "1" is written to the volatile memory cell, a read voltage is applied at the first source line while a first bias voltage is applied at the second source line and a second bias voltage is applied at a non-volatile word line.

19. The processing SOC of claim 18, wherein:
a "1" in one of the volatile memory cells is stored in a corresponding one of the non-volatile memory cells when the second resistive element is programmed to the low resistance state and the first resistive element is erased to the high resistance state;
a "0" in the one of the volatile memory cells is stored in the corresponding one of the non-volatile memory cells when the first resistive element is programmed to the low resistance state, the second resistive element is erased to the high resistance state.

* * * * *